US010527895B2

(12) United States Patent
Yang

(10) Patent No.: US 10,527,895 B2
(45) Date of Patent: Jan. 7, 2020

(54) ARRAY SUBSTRATE, LIQUID CRYSTAL PANEL, AND LIQUID CRYSTAL DISPLAY

(71) Applicant: Wuhan China Star Optoelectronics Technology Co., Ltd., Wuhan, Hubei (CN)

(72) Inventor: Chengao Yang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 14 days.

(21) Appl. No.: 15/735,954

(22) PCT Filed: Aug. 17, 2017

(86) PCT No.: PCT/CN2017/097748
§ 371 (c)(1),
(2) Date: Dec. 12, 2017

(87) PCT Pub. No.: WO2018/232925
PCT Pub. Date: Dec. 27, 2018

(65) Prior Publication Data
US 2019/0004358 A1    Jan. 3, 2019

(30) Foreign Application Priority Data

Jun. 20, 2017  (CN) .......................... 2017 1 0469944

(51) Int. Cl.
*G02F 1/1345* (2006.01)
*H01L 27/32* (2006.01)
(Continued)

(52) U.S. Cl.
CPC ...... *G02F 1/13452* (2013.01); *H01L 27/3276* (2013.01); *H01L 27/3279* (2013.01);
(Continued)

(58) Field of Classification Search
CPC ............. H01L 27/3276; H01L 27/3279; G02F 1/13452; H05K 1/028; H05K 1/189
See application file for complete search history.

(56) References Cited

U.S. PATENT DOCUMENTS 9,647,052 B2   5/2017  Youn et al.
9,786,229 B2  10/2017  Lee et al.
(Continued)

FOREIGN PATENT DOCUMENTS

| CN | 104330906 A  | 2/2015 |
| CN | 106205394 A  | 12/2016 |
| JP | 2016173461 A | 9/2016 |

*Primary Examiner* — Phat X Cao
(74) *Attorney, Agent, or Firm* — Andrew C. Cheng

(57) ABSTRACT

The present invention discloses an array substrate, a liquid crystal panel and a liquid crystal display. The array substrate includes a main substrate and an auxiliary substrate, and a plurality of gate scan lines are provided on the main substrate; a gate driver circuit and a plurality of first wires connected to the gate driver circuit are provided on the auxiliary substrate; wherein the auxiliary substrate is bonded to the main substrate so that the plurality of first wires are electrically connected to the plurality of gate scan lines, and the auxiliary substrate is a flexible substrate and is capable of being bent and disposed corresponding to the main substrate. The present invention can realize the ultra-narrow frame of the liquid crystal panel and improve the driving ability of the display.

14 Claims, 7 Drawing Sheets

(51) Int. Cl.
  *H05K 1/02* (2006.01)
  *H05K 1/18* (2006.01)
(52) U.S. Cl.
  CPC ............. *H05K 1/028* (2013.01); *H05K 1/189* (2013.01); *G02F 2202/22* (2013.01); *G02F 2202/28* (2013.01); *H05K 2201/056* (2013.01); *H05K 2201/09281* (2013.01); *H05K 2201/10136* (2013.01)

(56) References Cited

U.S. PATENT DOCUMENTS

| | | | |
|---|---|---|---|
| 2013/0002583 A1* | 1/2013 | Jin | G06F 1/1637 345/173 |
| 2014/0042406 A1* | 2/2014 | Degner | H01L 27/326 257/40 |
| 2016/0172623 A1 | 6/2016 | Lee | |

* cited by examiner

ARRAY SUBSTRATE, LIQUID CRYSTAL PANEL, AND LIQUID CRYSTAL DISPLAY

TECHNICAL FIELD

The present invention relates to the field of liquid crystal display technology, and more particularly to an array substrate, a liquid crystal panel, and a liquid crystal display.

DESCRIPTION OF RELATED ART

With the development of liquid crystal panel technology, a variety of terminal panels is developing toward thin and light design, high screen-to-body ratio, and narrow frame or even no frame. The narrower the frame, the larger the size of the display area of the terminal panel with the same size; the better the field of view, the better the viewing effect.

During the long-term research and development, the inventor of the present invention have found that the current LTPS (Low Temperature Polycrystalline Silicon) panel technology has narrowed the frame close to 0.7 mm by compressing the circuit size of GOA (Gate Driver On Array), using the IC (Integrated Circuit) chips of TDDI (Touch and Display Driver Integration), and reduing the distance between the wirings. However, in order to ensure the effective work of the GOA circuit, the panel reliability test and the various signal lines cut off from each other, the frame has compressed close to the limit.

SUMMARY

The technical problem that the present invention mainly solves is to provide an array substrate, a liquid crystal panel and a liquid crystal display, which can realize the ultra-narrow frame of the liquid crystal panel and improve the driving ability of the display.

To solve the technical problem, a technical proposal adopted by the present invention is to provide an array substrate including:

a main substrate, a plurality of gate scan lines being provided on the main substrate;

an auxiliary substrate, a gate driver circuit being provided on the auxiliary substrate and a plurality of first wires being connected to the gate driver circuit;

wherein the auxiliary substrate is bonded on the main substrate so that the plurality of first wires are electrically connected to the plurality of gate scan lines respectively, and the auxiliary substrate is a flexible substrate and is capable of being bent and disposed corresponding to the main substrate.

To solve the technical problem, another technical proposal adopted by the present invention is to provide a liquid crystal panel, including the array substrate and a counter substrate opposite to the main substrate of the array substrate.

To solve the technical problems, another technical proposal adopted by the present invention is to provide a liquid crystal display, including the liquid crystal panel and a backlight module arranged below the liquid crystal panel.

In the embodiment of the present invention, by arranging the gate driver circuit on the bendable auxiliary substrate, the space occupied by the gate driver circuit on the array substrate is saved, the frame width of the display can be reduced, and the panel reliability test capability can be improved.

DETAILED DESCRIPTION OF EMBODIMENTS

The technical proposals in the embodiments of the present invention will be described in detail below in connection with the accompanying drawings in the embodiments of the present invention.

Figure 1:
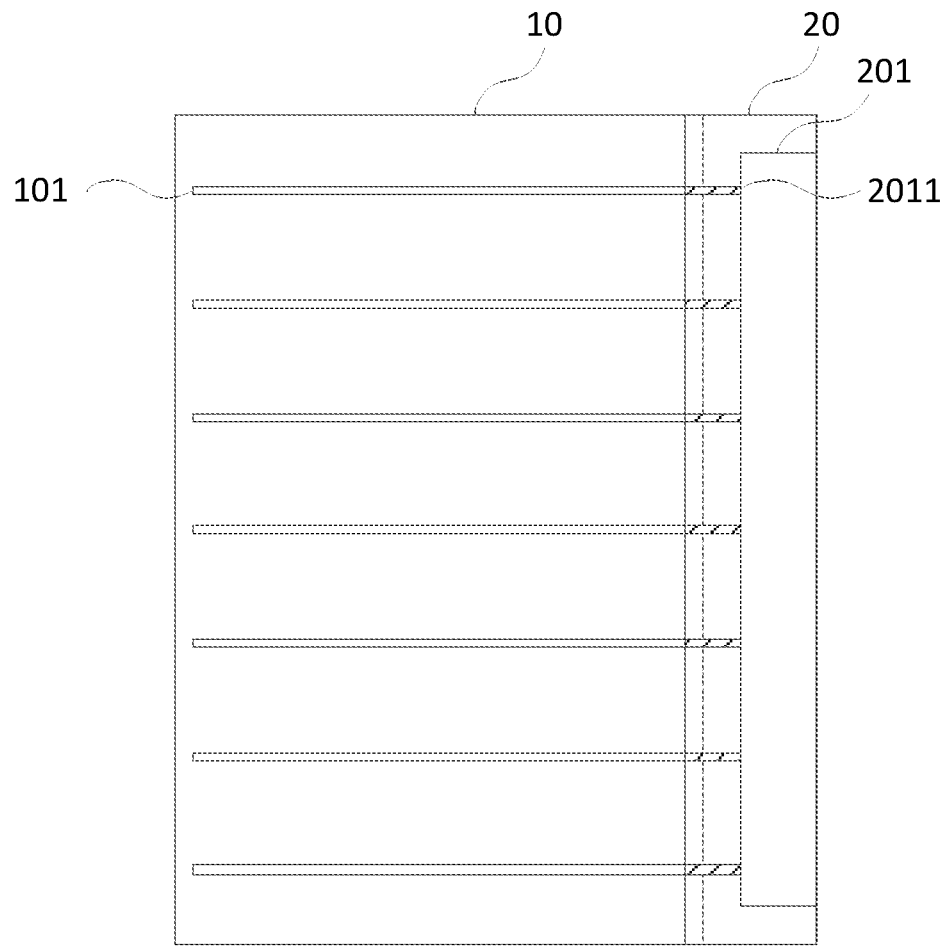
FIG. 1 is a schematic structural view of a first embodiment of an array substrate of the present invention.

Referring to FIG. 1, the first embodiment of the array substrate of the present invention includes a main substrate 10 and an auxiliary substrate 20, a plurality of gate scan lines 101 are provided on the main substrate 10; a gate driver circuit 201 is provided on the auxiliary substrate 20 and a plurality of first wires 2011 are connected to the gate driver circuit 201.

The auxiliary substrate 20 is bonded on the main substrate 10 so that the plurality of first wires 2011 are electrically connected to the plurality of gate scan lines 101, and the auxiliary substrate 20 is a flexible substrate and can be bent and disposed corresponding to the main substrate 10.

Alternatively, the gate driver circuit 201 is a GOA circuit.

Figure 2:
FIG. 2 is a schematic structural view of an auxiliary substrate of the first embodiment of the array substrate according to the present invention.
Figure 3:
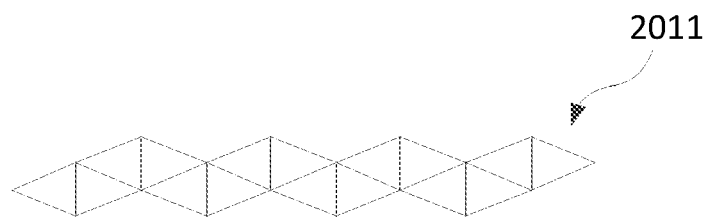
FIG. 3 is a schematic structural view of a first wire of the auxiliary substrate of the first embodiment of the array substrate according to the present invention.

Referring to FIGS. 2 and 3, the gate driver circuit 201 includes a multi-layered structure, at least one metal layer is selected to extend a plurality of wires to form the first wires 2011; wherein the first wire 2011 in the bending region of the auxiliary substrate 20 is provided with a hole-like hollow structure.

Alternatively, the metal layer may be a layer having better ductility.

Alternatively, the hole-like hollow structure may be triangular holes or circular, rectangular or other shaped holes to enhance the bending ability of the first wire 2011.

Alternatively, the first wires 2011 may be prepared simultaneously with the gate driver circuit 201, or may be prepared separately after the gate driver circuit 201 is prepared.

In the embodiment of the present invention, by arranging the gate driver circuit on the bendable auxiliary substrate, the space occupied by the gate driver circuit on the array substrate is saved, the frame width of the display can be reduced, and the panel reliability test capability can be improved.

Figure 4:
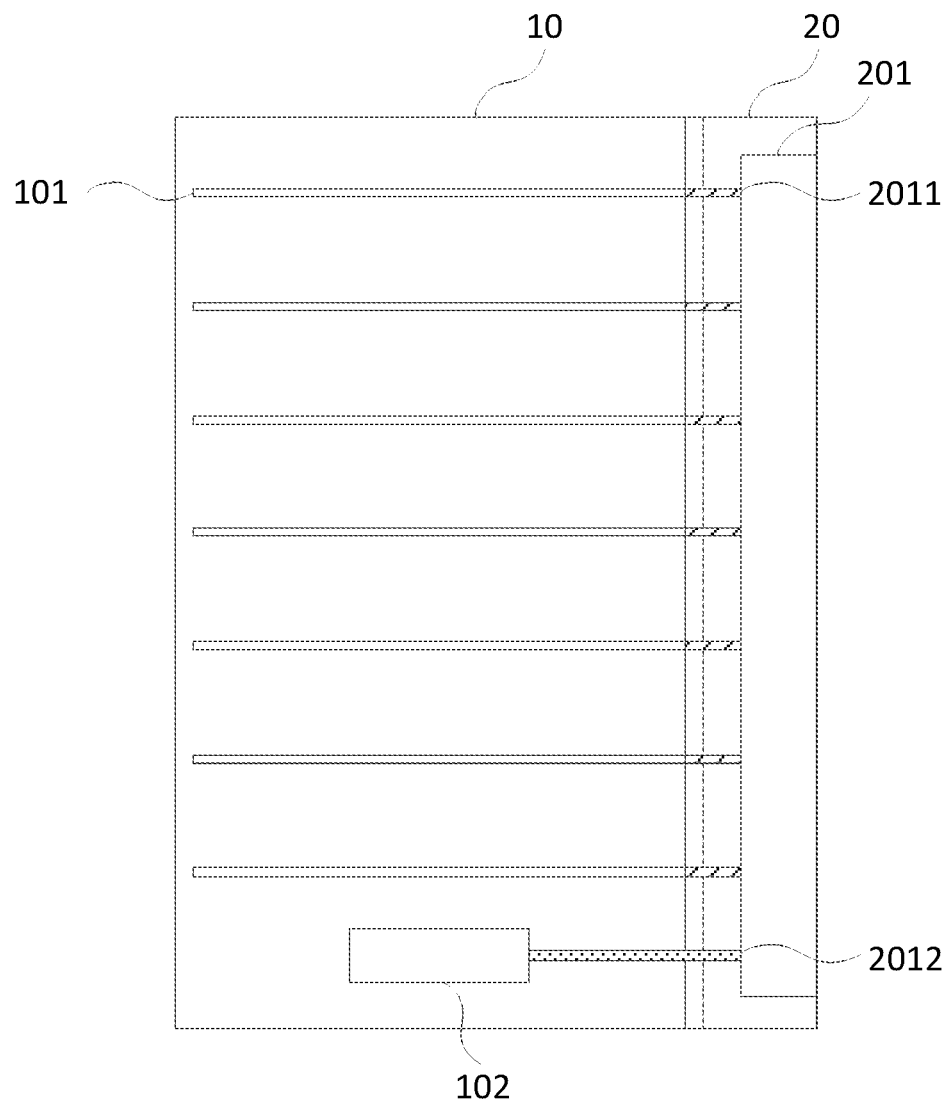
FIG. 4 is a schematic structural view of a second embodiment of the array substrate of the present invention.

Referring to FIG. 4, the second embodiment of the array substrate of the present invention includes the main substrate 10 and the auxiliary substrate 20, a plurality of gate lines 101 and a display driver chip 102 are provided on the main substrate 10; the gate driver circuit 201 and the plurality of first wires 2011 and at least one second wire 2012 connected to the gate driver circuit 201 respectively are provided on the auxiliary substrate 20.

The auxiliary substrate 20 is bonded on the main substrate 10 so that the plurality of first wires 2011 are electrically connected to the plurality of gate scan lines 101, the second wire 2012 is electrically connected to the display driver chips 102, and the auxiliary substrate 20 is a flexible substrate and can be bent and disposed corresponding to the main substrate 10.

Specifically, the display driver chip 102 transmits a display drive signal 201 through the second wire 2012 and triggers the gate driver circuit 201, the gate driver circuit 201 transmits scan signals to the main substrate 10 through the first wires 2011, the main substrate receives the scan signals through the gate scan lines 101 electrically connected to the wires 2011, and causes the array substrate to display under the drive of data signals (not shown).

Figure 5:
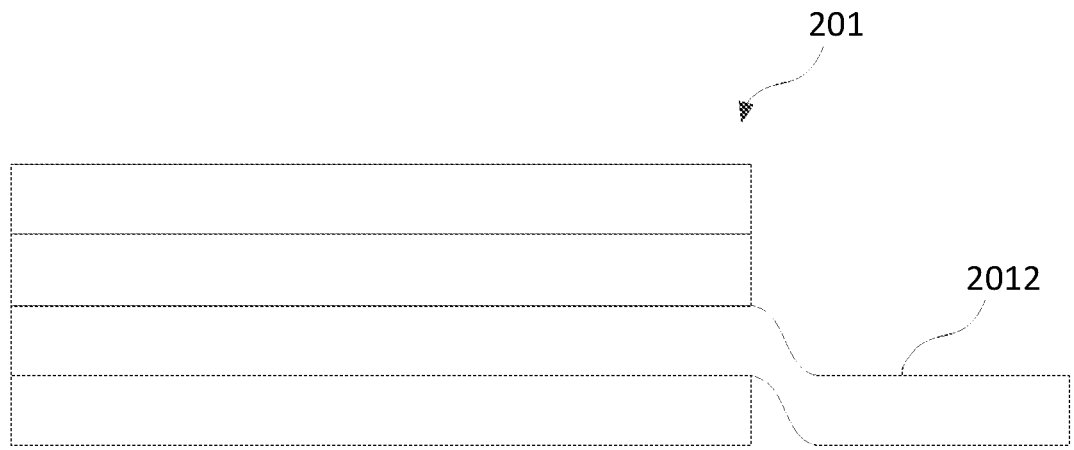
FIG. 5 is a schematic structural view of an auxiliary substrate of the second embodiment of the array substrate according to the present invention.

Referring to FIGS. 3 to 5, the gate driver circuit 201 includes a multi-layered structure, at least one metal layer is selected to extend the plurality of wires to form the first wires 2011 and the second wire 2012; wherein the first wires 2011 and the second wire 2012 in the bent region of the auxiliary substrate 20 are provided with a hole-like hollow structure.

Alternatively, the first wires 2011 and the second wire 2012 may be extended from the same metal layer of the gate driver circuit 201, or may be extended from the different metal layers of the gate driver circuit 201.

Alternatively, the hole-like hollow structure of the second wire 2012 may be the same as the shape of the holes of the first wire 2011, such as triangular, circular, rectangular or other shapes, or may be different with the shape of holes of the first wire 2011.

Alternatively, the second wire 2012 may be prepared simultaneously with the gate driver circuit 201, or may be prepared separately after the gate driver circuit 201 is prepared.

In the embodiment of the present invention, by arranging the gate driver circuit on the bendable auxiliary substrate, the space occupied by the gate driver circuit on the array substrate is saved, the frame width of the display can be reduced, and the panel reliability test capability can be improved.

Figure 6:
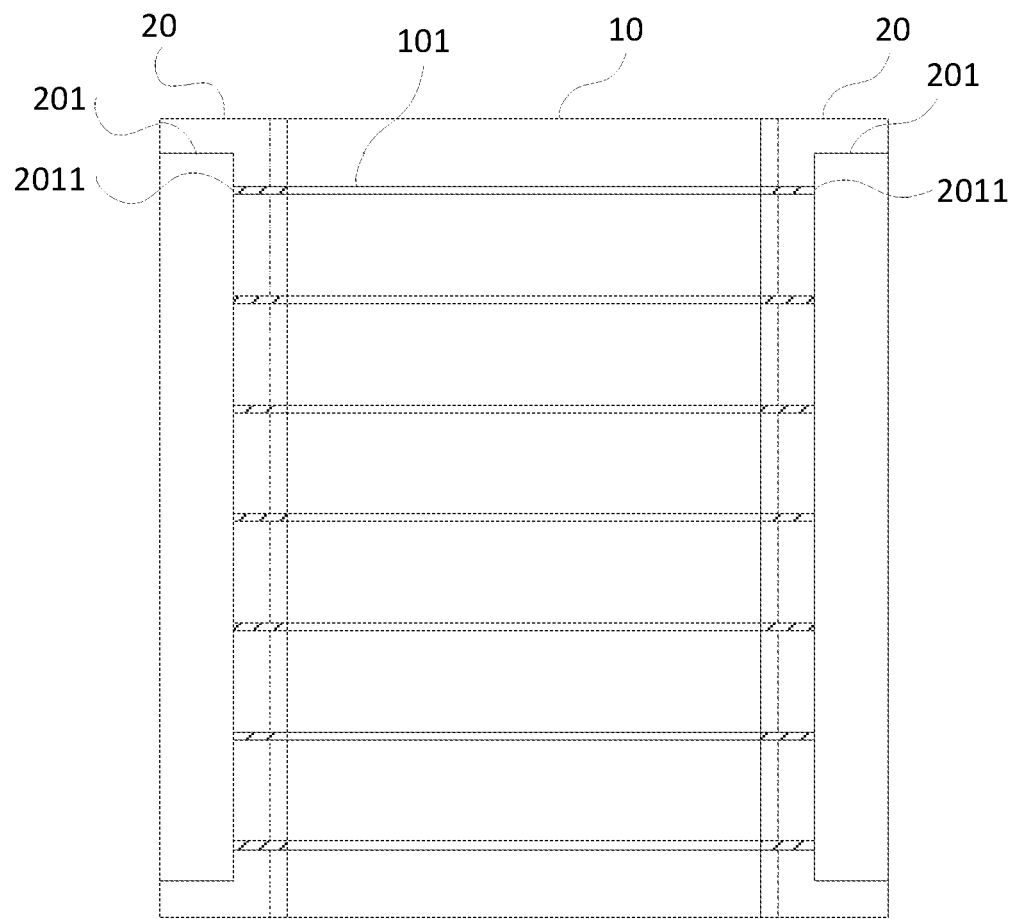
FIG. 6 is a schematic structural view of a third embodiment of the array substrate of the present invention.

Referring to FIG. 6, the third embodiment of the array substrate of the present invention includes the main substrate 10 and the two auxiliary substrates 20, the plurality of gate lines 101 are provided on the main substrate 10; the gate driver circuits 201 and the plurality of first wires 2011 connected to the gate driver circuits 201 are provided on the auxiliary substrates 20.

Alternatively, the gate driver circuit 201 is a GOA circuit, and the gate scan line 101 is connected to the GOA circuits of the two auxiliary substrates 20 respectively, and works under the coaction of the two GOA circuits.

Specifically, the structure of the auxiliary substrate 20 is described in the first embodiment of the array substrate.

In the embodiment of the present invention, by arranging the gate driver circuit on the bendable auxiliary substrate, the space occupied by the gate driver circuit on the array substrate is saved, the frame width of the display can be reduced, and the panel reliability test capability can be improved.

Figure 7:
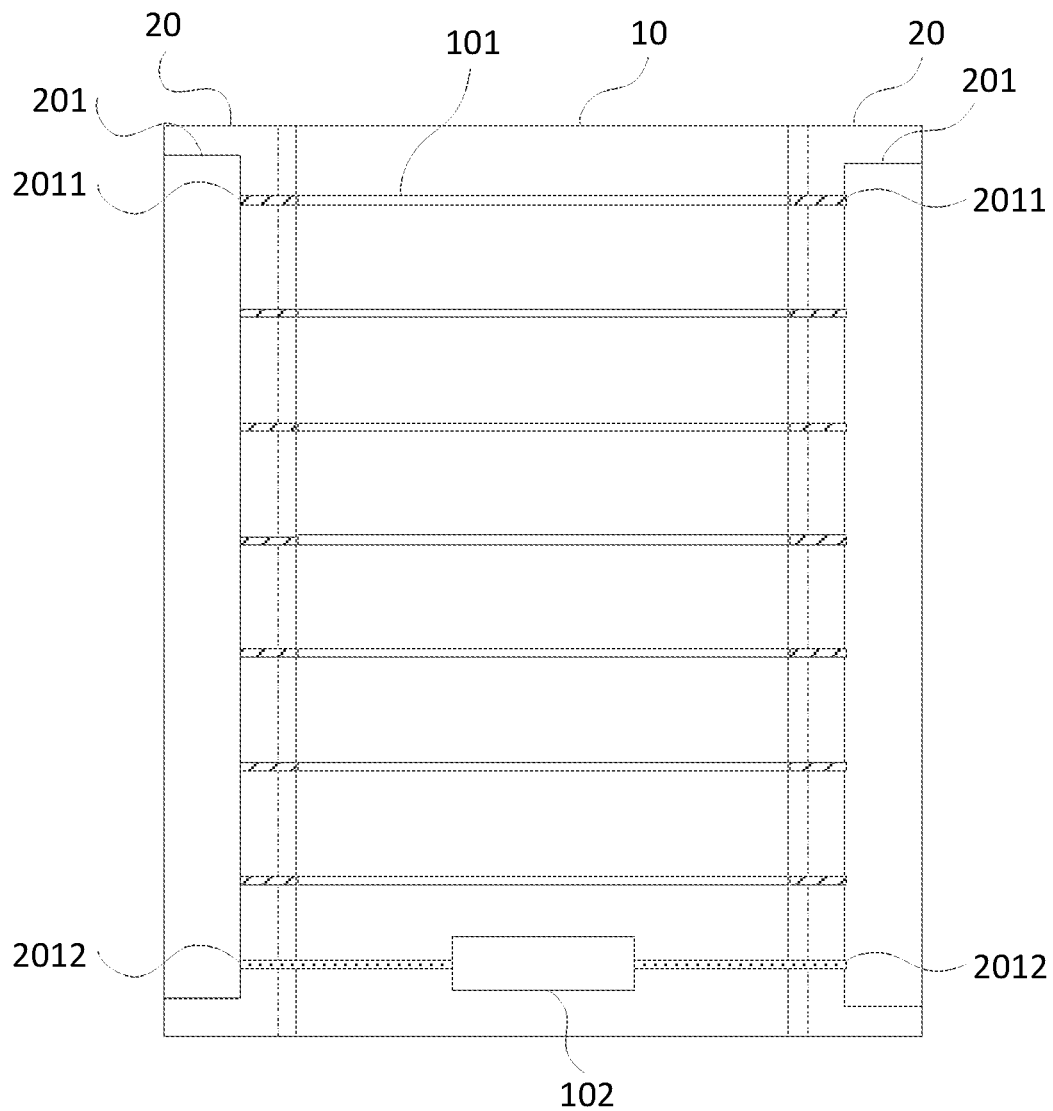
FIG. 7 is a schematic structural view of a fourth embodiment of the array substrate of the present invention.

Referring to FIG. 7, the fourth embodiment of the array substrate of the present invention includes the main substrate 10 and the two auxiliary substrates 20, the plurality of gate lines 101 and a display driver chip 102 are provided on the main substrate 10; the gate driver circuits 201 and the plurality of first wires 2011 and at least one second wire 2012 connected to the gate driver circuits 201 respectively are provided on the auxiliary substrates 20.

Alternatively, the gate driver circuit 201 is a GOA circuit, and the gate scan line 101 is connected to the GOA circuits of the two auxiliary substrates 20 respectively, and works under the coaction of the two GOA circuits.

Specifically, the structure of the auxiliary substrate 20 is described in the second embodiment of the array substrate.

In the embodiment of the present invention, by arranging the gate driver circuit on the bendable auxiliary substrate, the space occupied by the gate driver circuit on the array substrate is saved, the frame width of the display can be reduced, and the panel reliability test capability can be improved.

Figure 8:
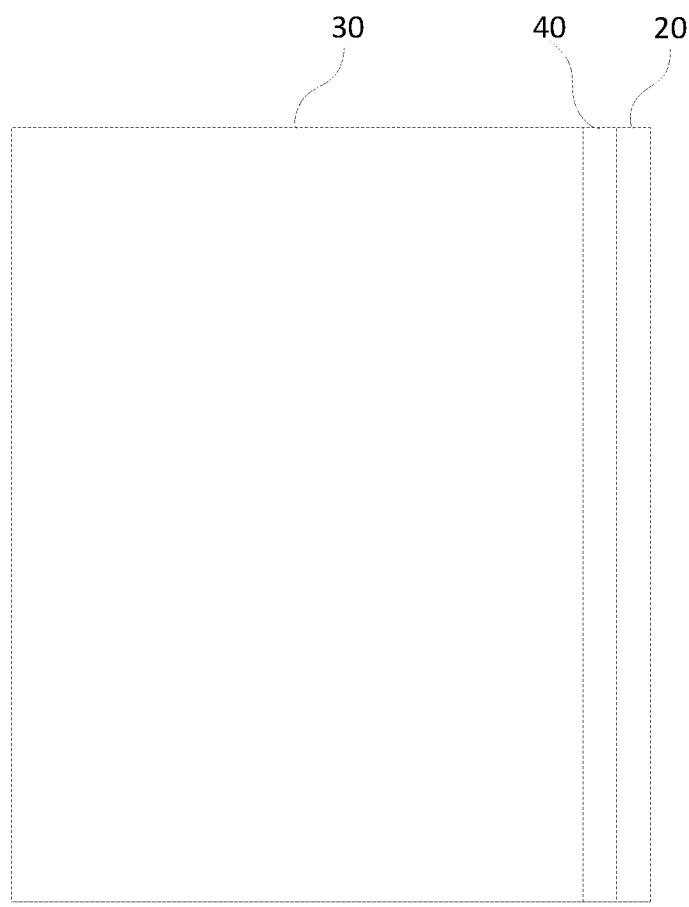
FIG. 8 is a schematic plan view of the structure of an embodiment of a liquid crystal panel according to the present invention.
Figure 9:
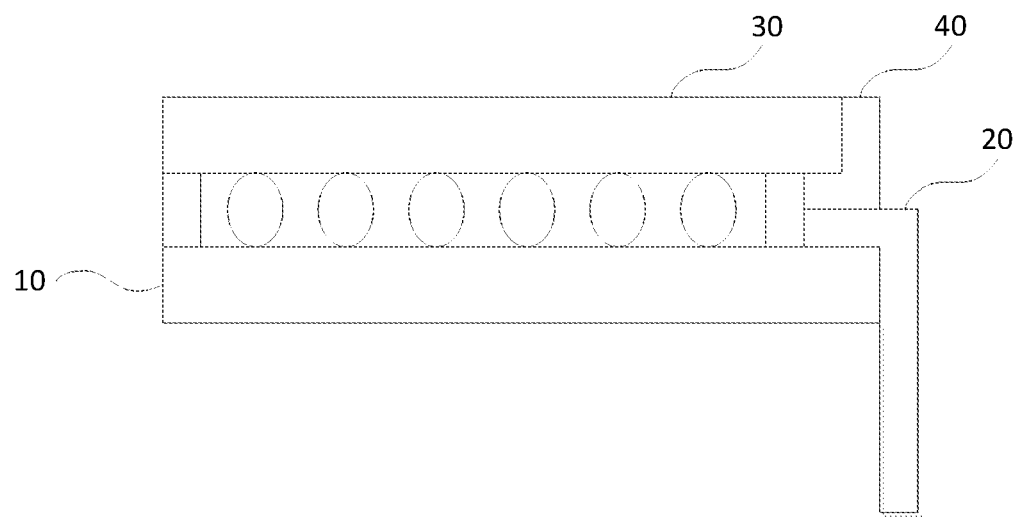
FIG. 9 is a schematic front view of of the embodiment of the liquid crystal panel according to the present invention.

Referring to FIGS. 8 and 9, an embodiment of a liquid crystal panel of the present invention includes the array substrate and a counter substrate 30 disposed opposite to the main substrate 10 of the array substrate.

Alternatively, the counter substrate 30 is smaller in size than the main substrate 10 so that the edge of the main substrate 10 is exposed, and the auxiliary substrate 20 is bonded to the exposed edge of the main substrate 10 and further coated with the antistatic adhesive 40.

Alternatively, the counter substrate 30 may be a CF (Color filter) substrate.

In the embodiment of the present invention, by arranging the gate driver circuit on the bendable auxiliary substrate, the space occupied by the gate driver circuit on the array substrate is saved, the frame width of the display can be reduced, and the panel reliability test capability can be improved.

Figure 10:
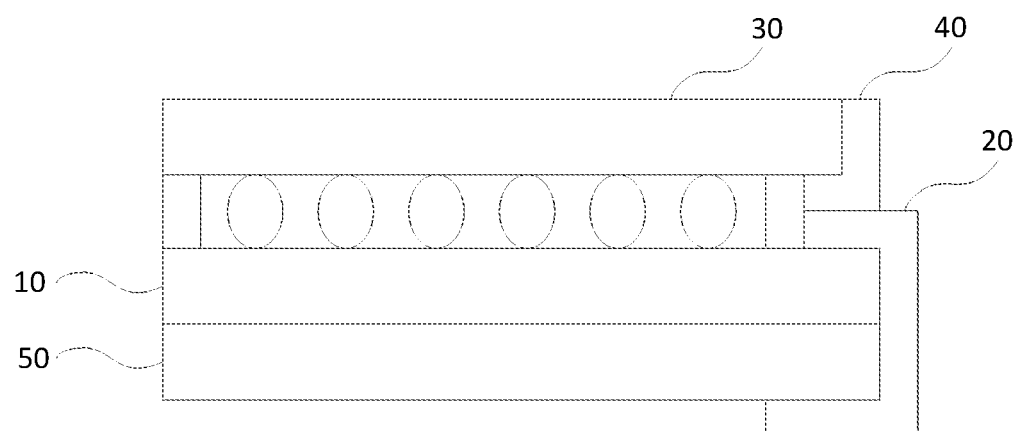
FIG. 10 is a schematic structural view of an embodiment of an liquid crystal display according to the present invention.

Referring to FIG. 10, an embodiment of a liquid crystal display of the present invention includes the liquid crystal panel and a backlight module 50 provided below the liquid crystal panel.

Alternatively, the auxiliary substrate 20 is bent and bonded to the side of the backlight module 50 away from the liquid crystal panel.

Alternatively, the frame width of the liquid crystal display is less than or equal to 0.4 mm.

Alternatively, the liquid crystal display may be an In-cell touch display.

In the embodiment of the present invention, by arranging the gate driver circuit on the bendable auxiliary substrate, the space occupied by the gate driver circuit on the array substrate is saved, the frame width of the display can be reduced, and the panel reliability test capability can be improved.

Above are only embodiments of the present invention is not patented and therefore limit the scope of the present invention, the use of any content of the present specification and drawings made equivalent or equivalent structural transformation process, either directly or indirectly related to the use of other technologies areas are included in the same way the scope of the patent protection of the present invention.

What is claimed is:
1. A liquid crystal panel, wherein the liquid crystal panel comprises an array substrate and a counter substrate disposed opposite to a main substrate of the array substrate, the array substrate comprising:
   the main substrate, a plurality of gate scan lines being provided on the main substrate;

an auxiliary substrate, a gate driver circuit and a plurality of first wires connected to the gate driver circuit being provided on the auxiliary substrate;
wherein the auxiliary substrate is bonded on the main substrate so that the plurality of first wires are electrically connected to the plurality of gate scan lines respectively, and the auxiliary substrate is a flexible substrate and is capable of being bent and disposed corresponding to the main substrate;
the gate driver circuit is a GOA circuit, the plurality of first wires are formed by extending at least one metal layer in the GOA circuit; and
the first wires in a bent region of the auxiliary substrate is provided with a hole-like hollow structure;
the auxiliary substrate is bent to form two substantially parallel attaching parts and a connection part connected between the two attaching parts, and the main substrate is inserted between the two attaching parts.

2. The liquid crystal panel according to claim 1, wherein the main substrate is further provided with a display driver chip, and the auxiliary substrate is further provided with at least one second wire connected to the gate driver circuit, when the auxiliary substrate is bonded on the main substrate, the second wire is electrically connected to the display driver chip.

3. The liquid crystal panel according to claim 2, wherein the gate driver circuit is a GOA circuit, and the second wire is formed by extending at least one metal layer in the GOA circuit.

4. The liquid crystal panel according to claim 2, wherein the second wire in the bent region of the auxiliary substrate is provided with a hole-like hollow structure.

5. The liquid crystal panel according to claim 1, wherein the counter substrate is smaller in size than the main substrate so that an edge of the main substrate is exposed, and the auxiliary substrate is bonded on an exposed edge of the main substrate and further coated with the antistatic adhesive.

6. A liquid crystal display, wherein the liquid crystal display comprises the liquid crystal panel according to claim 1 and a backlight module disposed below the liquid crystal panel.

7. The liquid crystal display according to claim 6, wherein the main substrate is further provided with a display driver chip, and the auxiliary substrate is further provided with at least one second wire connected to the gate driver circuit; when the substrate is bonded on the main substrate, the second wire is electrically connected to the display driver chip.

8. The liquid crystal display according to claim 7, wherein the gate driver circuit is a GOA circuit, and the second wire is formed by extending at least one metal layer in the GOA circuit.

9. The liquid crystal display according to claim 7, wherein the second wire in a bent region of the auxiliary substrate is provided with a hole-like hollow structure.

10. The liquid crystal display according to claim 6, wherein the counter substrate is smaller in size than the main substrate so that an edge of the main substrate is exposed, and the auxiliary substrate is bonded on the exposed edge of the main substrate and further coated with the antistatic adhesive.

11. The liquid crystal display according to claim 6, wherein, the auxiliary substrate is bent and bonded to a side of the backlight module away from the liquid crystal panel.

12. The liquid crystal panel according to claim 1, wherein, the main substrate includes a top surface, a bottom surface, and an edge surface connected between the top surface and the bottom surface; one of the two attaching parts is bonded to the top surface, the connection part is bonded to the edge surface, and another attaching part is arranged to be substantially parallel to the bottom surface to form a gap configured to receive a backlight module between the another attaching part and the bottom surface.

13. The liquid crystal display according to claim 11, wherein, the main substrate includes a top surface, a bottom surface, and an edge surface connected between the top surface and the bottom surface; one of the two attaching parts is bonded to the top surface, the connection part is bonded to the edge surface, and another attaching part is arranged to be substantially parallel to the bottom surface.

14. The liquid crystal display according to claim 13, wherein, the backlight module is inserted between the another attaching part and the bottom surface, and the another attaching part is bonded to the side of the backlight module away from the liquid crystal panel.

* * * * *